(12) United States Patent
He et al.

(10) Patent No.: US 11,195,448 B2
(45) Date of Patent: Dec. 7, 2021

(54) DISPLAY AND MOBILE TERMINAL (71) Applicant: Huawei Technologies Co., Ltd., Shenzhen (CN)

(72) Inventors: Hu He, Dongguan (CN); Haiming He, Shenzhen (CN); Chun Yen Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/643,395

(22) PCT Filed: Aug. 31, 2017

(86) PCT No.: PCT/CN2017/099950
§ 371 (c)(1),
(2) Date: Feb. 28, 2020

(87) PCT Pub. No.: WO2019/041237
PCT Pub. Date: Mar. 7, 2019

(65) Prior Publication Data
US 2020/0372850 A1 Nov. 26, 2020

(51) Int. Cl.
*G09G 3/20* (2006.01)
*H05K 1/18* (2006.01)
(Continued)

(52) U.S. Cl.
CPC ......... *G09G 3/2092* (2013.01); *G06F 1/1626* (2013.01); *G06F 1/1632* (2013.01); *H05K 1/028* (2013.01); *H05K 1/189* (2013.01); *G09G 2310/0275* (2013.01); *H05K 2201/10128* (2013.01)

(58) Field of Classification Search
CPC ......... G09G 3/2092; G09G 2310/0275; G09G 3/20; G06F 1/1626; G06F 1/1632; G06F 1/16; H05K 1/028; H05K 1/189; H05K 2201/10128
See application file for complete search history.

(56) References Cited

U.S. PATENT DOCUMENTS 8,829,508 B2　9/2014　Park
2013/0002583 A1　1/2013　Jin et al.
(Continued)

FOREIGN PATENT DOCUMENTS

| CN | 102855821 A | 1/2013 |
|---|---|---|
| CN | 102855822 A | 1/2013 |

(Continued)

*Primary Examiner* — Bryan Earles
(74) *Attorney, Agent, or Firm* — Conley Rose, P.C.

(57) ABSTRACT

A display includes a display panel and at least one display driver chip. The display panel includes a display area and a non-display area surrounding the display area. The display area includes a planar area and a curved bending area located on at least one side of the planar area, where a longitudinal direction of each data signal line is perpendicular to a longitudinal direction of the side of the planar area on which the curved bending area is arranged, and each data signal line extends to a non-display area on the side of the curved bending area of the display area. The display driver chip is connected to data signal lines by using a chip-on-film, and the display driver chip is located in concave space.

20 Claims, 6 Drawing Sheets

(51) Int. Cl.
    *H05K 1/02*        (2006.01)
    *G06F 1/16*        (2006.01)

(56)            References Cited

U.S. PATENT DOCUMENTS

| | | | |
|---|---|---|---|
| 2014/0217382 A1* | 8/2014 | Kwon | H01L 51/5246 |
| | | | 257/40 |
| 2015/0028363 A1 | 1/2015 | Lee | |
| 2015/0138041 A1* | 5/2015 | Hirakata | H01L 27/323 |
| | | | 345/1.3 |
| 2016/0293870 A1 | 10/2016 | Nakagawa | |
| 2016/0295176 A1 | 10/2016 | Jeong | |
| 2017/0123506 A1 | 5/2017 | Song et al. | |
| 2017/0255049 A1* | 9/2017 | Nishiyama | G02F 1/13454 |
| 2017/0288006 A1* | 10/2017 | Yang | H01L 27/3225 |
| 2017/0293194 A1* | 10/2017 | Hou | G02F 1/13306 |
| 2018/0183913 A1* | 6/2018 | Kwak | H04M 1/0268 |
| 2018/0253175 A1 | 9/2018 | Yao | |
| 2018/0310404 A1* | 10/2018 | Lim | H05K 3/3452 |
| 2018/0331124 A1* | 11/2018 | Cho | H01L 27/3276 |
| 2019/0004569 A1 | 1/2019 | Jin et al. | |

FOREIGN PATENT DOCUMENTS

| | | |
|---|---|---|
| CN | 103325317 A | 9/2013 |
| CN | 104317444 A | 1/2015 |
| CN | 104952883 A | 9/2015 |
| CN | 205121507 U | 3/2016 |
| CN | 105573654 A | 5/2016 |
| CN | 205539814 U | 8/2016 |
| CN | 106502606 A | 3/2017 |
| CN | 106816460 A | 6/2017 |
| WO | 2015071820 A1 | 5/2015 |

\* cited by examiner

DISPLAY AND MOBILE TERMINAL

CROSS-REFERENCE TO RELATED APPLICATIONS

This application is a national stage of International Patent Application No. PCT/CN2017/099950 filed on Aug. 31, 2017, which is hereby incorporated by reference in its entirety.

TECHNICAL FIELD

This application relates to the field of display technologies, and in particular, to a display and a mobile terminal.

BACKGROUND

Figure 1:
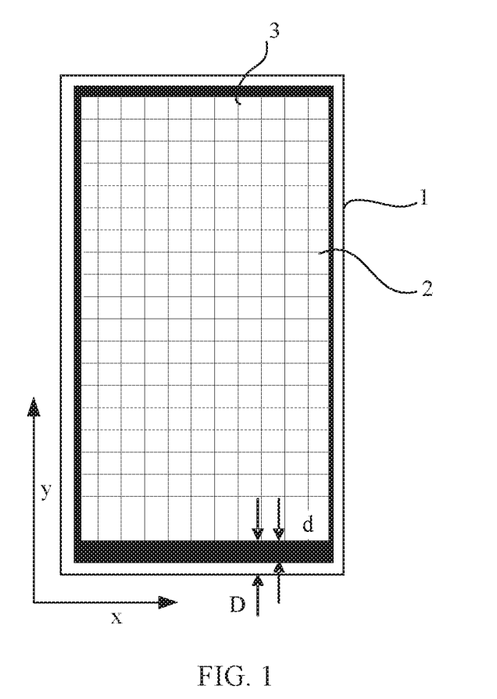
FIG. 1 is a schematic structural diagram of a mobile terminal in the prior art.
Figure 2:
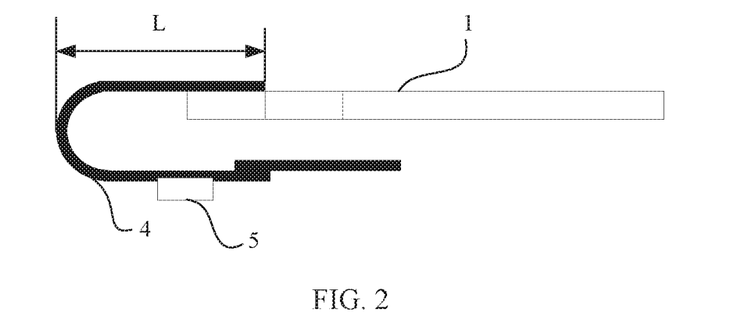
FIG. 2 is a schematic diagram of a connection between a display driver chip and a display panel in the prior art.

Ultimate full-screen mobile phones have become an important trend in mobile phone design. In the existing mobile phone design, a frame of a display is one of the most important factors that restrict a frame of a mobile phone. A conventional display is driven by a display driver chip on a short side. To be specific, the display driver chip is placed on a short side of a screen, so that a short side frame of a mobile phone is relatively long, as shown in FIG. 1 and FIG. 2. A placement direction of a mobile terminal in FIG. 1 is a reference direction. Two vertical sides are long sides of the mobile terminal, and two horizontal sides are short sides of the mobile terminal. As shown in FIG. 1 and FIG. 2, signal lines in a horizontal direction on a display panel 1 are gate scanning lines 2, and signal lines in a vertical direction are data signal lines 3. The data signal lines 3 are connected to a display driver chip 5 by using a chip-on-film 4. If a DDIC (Display driving IC, display driver chip 5) drives the display on the short side, a corresponding bottom frame d of the display panel 1 is relatively large. With the current processing level of the industry, a design value of d is expected to exceed 3 mm. However, a corresponding signal wiring area, test module, bonding area, and the like need to be arranged on the bottom frame of the mobile terminal. As a result, the bottom frame D of the device is relatively large.

SUMMARY

This application provides a display and a mobile terminal, to reduce a width of a bottom frame of a mobile terminal.

According to a first aspect, a display is provided, where the display includes a display panel and at least one display driver chip.

Data signal lines and gate scanning lines crossed in a grid shape are arranged on the display panel. The display panel includes a display area and a non-display area surrounding the display area. The display area includes a planar area and a curved bending area located on at least one side of the planar area. A longitudinal direction of each data signal line is perpendicular to a longitudinal direction of the side of the planar area on which the curved bending area is arranged, and each data signal line extends to a non-display area on the side of the curved bending area of the display area.

The display driver chip is connected by using a chip-on-film to the data signal lines that extend to the non-display area. The chip-on-film is bent in concave space formed by the curved bending area of the display area. The display driver chip is located in the concave space.

In the foregoing implementation solution, the display driver chip is moved from the bottom side of a mobile terminal to the left side (or the right side) of the mobile terminal, so that a width of a bottom frame of the mobile terminal can be effectively reduced, and a bending area of the display panel is properly used. Impact of the chip-on-film on a width of the mobile terminal in a horizontal direction is changed to impact in an oblique direction. Therefore, a width occupied by the chip-on-film in the horizontal direction is reduced. Further, impact on a frame width of the mobile terminal is reduced.

In a specific implementation solution, the display area includes two curved bending areas, and the two curved bending areas are arranged on two opposite sides of the planar area. In other words, both long sides of the display area are bent.

In a specific implementation solution, there are two display driver chips. One display driver chip is connected to some of the data signal lines by using a chip-on-film, and the other display driver chip is connected to remaining data signal lines by using a chip-on-film. Different quantities of display driver chips may be used. When two display driver chips are used, the two display driver chips are both configured to be connected to some of the data signal lines.

In a specific implementation solution, the two display driver chips are located on one side of the display, or the two display driver chips are respectively located on two sides of the display. The two display driver chips may be symmetrically disposed on two sides of the mobile terminal, or may be disposed on one side of the mobile terminal. In addition, there may be one display driver chip. When one display driver chip is used, the display driver chip is disposed on one side of the mobile terminal.

In a specific implementation solution, the chip-on-film includes a connecting portion connected to the data signal lines and a first bending portion connected to the connecting portion, where the first bending portion is located in the concave space. The display driver chip is located in bending space of the display by bending of the chip-on-film.

In a specific implementation solution, the display driver chip is disposed at the first bending portion. Further, space occupied by the entire display is reduced.

In a specific implementation solution, the chip-on-film further includes a second bending portion connected to the first bending portion. The second bending portion is located in the concave space. The display driver chip is disposed at the second bending portion.

In a specific implementation solution, the second bending portion is parallel to the planar area.

In a specific implementation solution, a vertical projection of the display driver chip on a plane parallel to the planar area is in a vertical projection of the planar area on the plane.

In a specific implementation solution, the chip-on-film is a single-layer chip-on-film, and the display driver chip is located on a side of the chip-on-film that faces away from the display panel.

In a specific implementation solution, the chip-on-film is a double-layer chip-on-film, and the display driver chip is located on a side of the chip-on-film that faces toward or away from the display panel.

According to a second aspect, a mobile terminal is provided, where the mobile terminal includes a housing, a middle frame disposed in the housing, the display according to any one of the first aspect and the implementation solutions, and a mainboard, where the display and the mainboard are disposed on the middle frame. The display driver chip is connected to the mainboard by using a flexible circuit board.

In the foregoing implementation solutions, the display driver chip is moved from the bottom side of the mobile terminal to the left side (or the right side) of the mobile terminal, so that a width of a bottom frame of the mobile terminal can be effectively reduced, and a bending area of the display panel is properly used. Impact of a chip-on-film on a width of the mobile terminal in a horizontal direction is changed to impact in an oblique direction. Therefore, a width occupied by the chip-on-film in the horizontal direction is reduced. Further, impact on a frame width of the mobile terminal is reduced.

In a specific implementation solution, a groove configured to accommodate the chip-on-film is made in the middle frame, which facilitates a disposition of a display.

DESCRIPTION OF EMBODIMENTS

To make objectives, technical solutions, and advantages of this application clearer, the following further describes this application in detail with reference to the accompanying drawings.

First, a structure of a display in the prior art is described in detail. As shown in FIG. 1, a display 1 includes a display area and a non-display area surrounding the display area, where the display area is configured to display an image and the non-display area is configured to cover cabling. The display 1 includes gate scanning lines 2 and data signal lines 3 that are crossed. A placement direction of the display 1 shown in FIG. 1 is a reference direction. Sides of the display 1 are classified into the top, bottom, left, and right sides. The top, bottom, left, and right sides of the display 1 are respectively corresponding to the top, bottom, left, and right sides of a mobile terminal. The top side of the mobile terminal is configured to dispose components such as a camera and an earpiece, and the bottom side of the mobile terminal is configured to dispose a touch control button (for example, a fingerprint device), a charging interface, and the like.

Referring to FIG. 1 and FIG. 2, in an existing driving manner, the gate scanning lines 2 are in a horizontal direction (an x direction), and outgoing line ends of the gate scanning lines 2 are located on the left and right sides of the display 1. The data signal lines 3 are in a vertical direction (a y direction), and outgoing line ends of the data signal lines 3 are located on the top and bottom sides of the display 1. The gate scanning lines 2 are controlled by corresponding GOA (Gate on Array) circuits on the left and right sides of a display panel. The GOA circuits and the data signal lines 3 are directly connected to a COF (Chip on Film, chip-on-film 4).

As shown in FIG. 2, during a specific connection, to reduce a frame of the mobile terminal, a display driver chip 5 is connected to the data signal lines 3 by using the chip-on-film 4. During a specific disposition, the chip-on-film 4 is bent once. In this way, the display driver chip 5 is located on the back side of the display 1, thereby reducing a width of the frame of the mobile terminal. However, because a relatively large width is still required when the chip-on-film 4 is bent, further narrowing of the frame of the mobile terminal is restricted.

Figure 3:
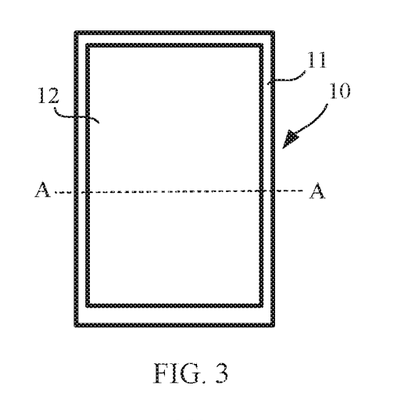
FIG. 3 is a schematic structural diagram of a display panel according to an embodiment of this application.
Figure 4:
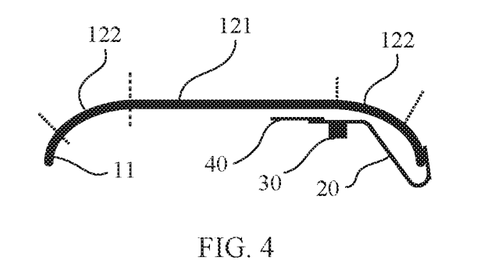
FIG. 4 is a sectional view of an A-A part in FIG. 3.

To resolve the foregoing technical problem, an embodiment of this application provides a display, as shown in FIG. 3 and FIG. 4. FIG. 3 is a schematic structural diagram of a display according to an embodiment of this application, and FIG. 4 is a sectional view of an A-A part in FIG. 3. A placement direction of the display shown in FIG. 3 is a reference direction, and four sides of the display provided in this embodiment of this application are also classified into the top, bottom, left, and right sides. In addition, the top, bottom, left, and right sides of the display are also corresponding to the top, bottom, left, and right sides of the mobile terminal. The top side of the mobile terminal is configured to dispose components such as a camera and an earpiece, and the bottom side of the mobile terminal is configured to dispose a touch control button, a charging interface, and the like.

It can be learned from FIG. 3 and FIG. 4 that the display provided in this embodiment of this application includes two parts: a display panel 10 and at least one display driver chip 30. As shown in FIG. 4, the display panel 10 is a panel having curved left and right sides. Specifically, the display panel 10 includes a display area 12 and a non-display area 11 surrounding the display area 12. The display area 12 includes a planar area 121 and a curved bending area 122 located on at least one side of the planar area 121. For example, there may be one or two curved bending areas 122. FIG. 4 shows two curved bending areas 122, and the two curved bending areas 122 of the display area 12 are arranged on two opposite sides of the planar area 121. It may also be understood that the two curved bending areas 122 are located on two sides of the display panel 10. Referring to FIG. 3 and FIG. 4, it can be learned that the curved bending areas 122 of the display area 12 are located on the left and right sides of the display area 12. In addition, the curved bending areas 122 of the display area 12 and the non-display area 11 connected to the left and right sides of the display area 12 form bending structures of the entire display panel 10 together.

Figure 9:
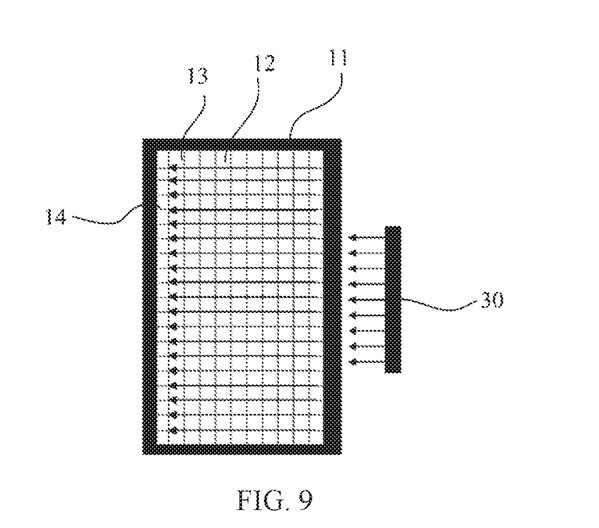
FIG. 9 to FIG. 12 are schematic diagrams of different disposing manners of a display driver chip according to an embodiment of this application.

As shown in FIG. 9, data signal lines 14 and gate scanning lines 13 crossed in a grid shape are arranged on the display panel 10 provided in this embodiment. However, during a specific arrangement of the gate scanning lines 13 and the data signal lines 14 provided in this embodiment, the gate scanning lines 13 are arranged from the top side to the bottom side of the display panel 10, and the gate scanning lines 13 extend to the display panel 10 in a vertical direction. A longitudinal direction of each data signal line 14 is perpendicular to a longitudinal direction of the side of the planar area 121 on which a curved bending area 122 is arranged. In other words, the data signal lines 14 are arranged from the left side to the right side of the display panel 10, and the data signal lines 14 extend to the non-display area 11 connected to the curved bending area 122 of the display area 12. In other words, the data signal lines 14 of the display provided in this embodiment extend from the left and right sides of the display panel 10, and the gate scanning lines 13 of the display extend from the top and bottom sides of the display panel 10. In addition, grid signals are controlled by corresponding GOA (Gate on Array) circuits on the top and bottom sides of the display panel 10. The GOA circuits and the data signal lines 3 are directly connected to a COF (Chip on Film, chip-on-film 4).

Referring to FIG. 4 and FIG. 9, when the display panel 10 and the display driver chip 30 are connected to the data signal lines 14, because too many data signal lines 14 are densely arranged, for a connection component in the prior art, for example, a spacing of a chip-on-film 20 is 10 to 2040 micrometers while a spacing of a flexible circuit board 40 is greater than 100 to 150 micrometers. Therefore, the data signal lines 14 that have a relatively small spacing and are densely arranged can be connected only by using the chip-on-film 20. In other words, the display driver chip 30 is connected by using the chip-on-film 20 to the data signal lines 14 that extend to the non-display area 11. In addition, the chip-on-film 20 has a particular capability of carrying an electric device. Therefore, the display driver chip 30 may be directly disposed on the chip-on-film 20.

Figure 5:
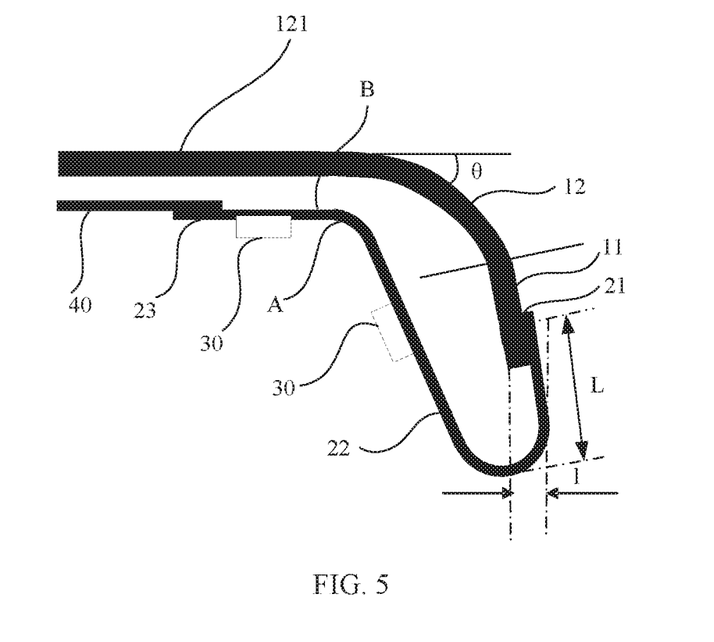
FIG. 5 is a schematic diagram of a connection between a display driver chip and a display panel.

During a specific disposition, referring to FIG. 4 and FIG. 5, FIG. 4 shows bending structures on two sides of the display, and FIG. 5 shows a bending structure on one side of the display shown in FIG. 4. A base material of the chip-on-film 20 used in the display shown in FIG. 4 and FIG. 5 is PI (polyimide). Therefore, the chip-on-film 20 may be bent in concave space formed by the curved bending areas 122 of the display area 12. In addition, the display driver chip 30 is also located in the concave space. As shown in FIG. 5, it can be learned from FIG. 5 that edges on two sides of the display panel 10 are bending structures (including the curved bending area 122 of the display area and the non-display area connected to the curved bending area 122). Therefore, the chip-on-film 20 connected to the non-display area 11 of the bending structures also extends in a strike direction of the curved bending area, and is bent inward the concave space of the display panel 10, and the display driver chip 30 disposed on and connected to the chip-on-film 20 is also located in the concave space. In addition, the display driver chip 30 is connected to a mainboard on the mobile terminal by using the flexible circuit board 40.

Still referring to FIG. 4 and FIG. 5, FIG. 5 is a schematic diagram of a bending structure on one side of the display shown in FIG. 4. It can be learned from FIG. 4 that there are two display driver chips 30 provided in this embodiment of this application. In addition, the two display driver chips 30 are respectively disposed on the left and right sides of the panel 10 that is of the display and that has two curved bent sides. Therefore, it can be learned from FIG. 4 that the chip-on-film 20 affects only left and right frames of the display of the mobile terminal. The right side of the display 10 is used as an example. As shown in FIG. 5, an absolute length of the chip-on-film 20 in the strike direction of the curved bending area 122 is L. However, because the strike direction of the curved bending area 122 is an oblique downward direction, an increased width of the display is 1=L*cos θ, where θ is a bending angle of the curved bending area 122 of the display area 12. In other words, a frame width that needs to be added to the mobile terminal to cover the chip-on-film 20 is 1. In comparison to FIG. 2 in the prior art, it can be learned that if a length of a horizontal part of the chip-on-film 20 is L, a frame width required by the mobile terminal to cover the length L of the chip-on-film 20 also needs to be L. It can be apparently learned from the foregoing comparison that impact 1 of the display in this application on a side frame of the mobile terminal is less than impact L of the display in the prior art on a bottom frame of the mobile terminal. In addition, in this embodiment of this application, the gate scanning lines 13 are located on the bottom side of the display panel 10. Grid signals are controlled by corresponding GOA (Gate on Array) circuits on the top and bottom sides of the display panel 10, and the GOA circuits are connected to the display driver chips 30. Because the display driver chips 30 are disposed on the left and right sides of the display panel 10, a width of the bottom frame of the display panel 10 can be effectively reduced.

It can be learned from the foregoing description that the display provided in this embodiment properly uses the bending area of the display panel 10. Impact of the chip-on-film 20 on a width of the mobile terminal in a horizontal direction is changed to impact in an oblique direction. Therefore, a width occupied by the chip-on-film 20 in the horizontal direction is reduced. Further, the frame width of the mobile terminal is reduced. In addition, the display driver chip 30 is moved from the bottom side of the mobile terminal to the left side (or the right side) of the mobile terminal, so that the width of the bottom frame of the mobile terminal can be effectively reduced, and a narrow frame of the mobile terminal can be developed.

For further understanding of the display provided in the embodiments of this application, the following describes the display in detail with reference to specific embodiments and accompanying drawings.

Embodiment 1

As shown in FIG. 3, FIG. 4, and FIG. 5, a structure of a display panel 10 provided in this embodiment is a structure of the display panel 10 described above. To be specific, the display panel 10 includes a display area 12 and a non-display area 11. As shown in FIG. 4, curved bending areas 122 are on the left and right sides of the display area 12 of the display panel 10, and the non-display area 11 connected to the curved bending areas 122 is disposed in a strike direction of the curved bending areas 122. Therefore, a bending structure is formed on each of the left and right sides of the display panel 10. In other words, two sides of the display disclosed in this embodiment are bent. Data scanning lines 14 on the display panel 10 extend to the left and right sides of the display panel 10, and are connected to a display driver chip 30 by using a chip-on-film 20.

During a specific connection, as shown in FIG. 5, the chip-on-film 20 includes a connecting portion 21 connected to the data signal lines 14 and a first bending portion 22 connected to the connecting portion 21. The first bending portion 22 is located in concave space. Specifically, the connecting portion 21 extends a specific length in a strike direction of the non-display area 11 of the bending structure, and is connected to the first bending portion 22 connected to the connecting portion 21 by using a curved bend. The first bending portion 22 may be parallel or approximately parallel to the connecting portion 21. To be specific, the first bending portion 22 may be disposed in parallel to the connecting portion 21, or may be disposed at a specific angle to the connecting portion 21. As shown in FIG. 5, the first bending portion 22 is disposed at the specific angle to the connecting portion 21. Therefore, the first bending portion 22 can more conveniently extend into the concave space of the display panel 10. The concave space of the display panel 10 is space enclosed by a planar area 121 of the display panel 10 and the bending structures on the left and right sides of the display panel 10.

During a specific disposition of the display driver chip 30, as shown by a dashed line in FIG. 5, the display driver chip 30 may be disposed at the first bending portion 22. Therefore, the concave space of the display panel 10 is properly used, and a spatial area occupied by the display driver chip 30 is reduced.

Still referring to FIG. 5, the chip-on-film 20 further includes a second bending portion 23 connected to the first bending portion 22, and the second bending portion 23 is located in the concave space. During a specific disposition, the first bending portion 22 and the second bending portion 23 are structures disposed along the bending structure of the display panel 10. Still referring to FIG. 5, the second bending portion 23 may be parallel to the planar area 121 of the display area 12, or may be at a specific angle to the planar area 121. During the specific disposition, a disposition may be performed according to an actual requirement. In a specific implementation solution, the second bending portion 23 is parallel to the planar area 121, thereby reducing space occupied by the second bending portion 23.

When the chip-on-film 20 includes the first bending portion 22 and the second bending portion 23, the display driver chip 30 may be disposed at the first bending portion 22, or may be disposed at the second bending portion 23. When the display driver chip 30 is disposed at the first bending portion 22, a disposition manner is the same as the foregoing disposition manner when the chip-on-film 20 includes only the first bending portion 22, and details are not described herein again. When the display driver chip 30 is disposed at the second bending portion 23, a vertical projection of the display driver chip 30 on a plane parallel to the planar area 121 is in a vertical projection of the planar area 121 on the plane. As shown in FIG. 5, the display driver chip 30 is located on the second bending portion 23. It can be learned from FIG. 5 that the second bending portion 23 is approximately parallel to the planar area 121. Therefore, when the display driver chip 30 is disposed at the second bending portion 23, a spatial relationship between the display driver chip 30 and the planar area 121 is as follows: The vertical projection of the display driver chip 30 on the plane parallel to the planar area 121 is in the vertical projection of the planar area 121 on the plane.

In addition, during the specific disposition, different chip-on-films 20 may be selected. Specifically, for example, the chip-on-film 20 is a single-layer chip-on-film 20, or is a double-layer chip-on-film. The display driver chip 20 can be disposed on only one side of the single-layer chip-on-film. When the chip-on-film 20 shown in FIG. 5 is the single-layer chip-on-film, the display driver chip 20 can be disposed on an A side or a B side of the chip-on-film 20. In other words, the display driver chip 20 can be disposed on only one of two sides of the single-layer chip-on-film. When the chip-on-film 20 shown in FIG. 5 is the double-layer chip-on-film, a display driver chip may be disposed on both the A side and the B side of the chip-on-film. The A side of the chip-on-film 20 is a side of the chip-on-film 20 that faces away from the display panel during a disposition. The B side of the chip-on-film 20 is a side of the chip-on-film 20 that faces toward the display panel during the disposition. During the specific disposition, different chip-on-films 20 may be selected based on space in the mobile terminal to perform a proper disposition.

In this embodiment of this application, it should be understood that different from the embodiment in which the display shown in FIG. 4 has bending structures on two sides, the display may use a bending structure on one side. To be specific, the left side or the right side of the display is a curved bending structure, and the other side is a horizontal planar structure. In other words, one side of the display area is bent, and the other side is not bent.

Figure 10:
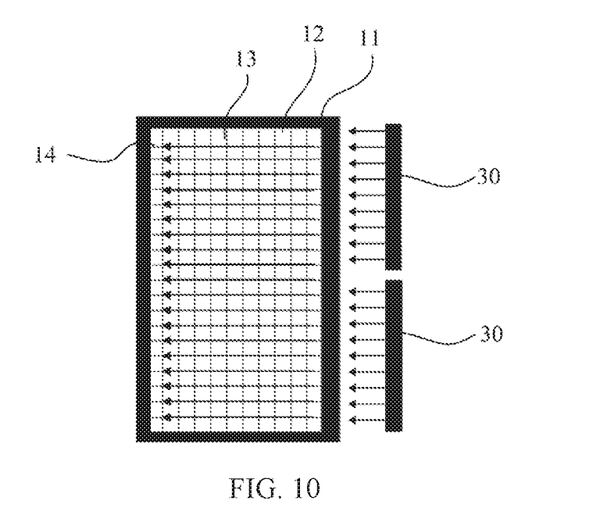

In addition, in this embodiment, there are one or more display driver chips 30. When the one or more display driver chips 30 are used, the display driver chips 30 are located on one side of the display panel 10. As shown in FIG. 4 and FIG. 5, the display driver chip 30 is located on the right side of the display panel 10. It should be understood that FIG. 4 and FIG. 5 are merely specific examples. Alternatively, the display driver chip 30 may be located on the left side of the display panel 10. For a specific manner of a connection between the display driver chip 30 and the display panel 10, refer to FIG. 9 and FIG. 10. FIG. 9 shows a manner of using one display driver chip 30. In this case, the display driver chip 30 is connected to all the data scanning lines 14 on the display panel 10. FIG. 10 shows a manner of using two display driver chips 30. In this case, one display driver chip 30 is connected to some of the data signal lines 14 by using a chip-on-film 20, and the other display driver chip 30 is connected to remaining data signal lines 14 by using a chip-on-film 20. Specifically, the two display driver chips 30 are disposed in a vertical direction. One display driver chip 30 is connected to the data signal lines 14 located at the upper half part of the display panel 10, and the other display driver chip 30 is connected to the data signal lines 14 located at the lower half part of the display panel 10.

It can be learned from the foregoing description that different quantities of display driver chips 30 provided in this embodiment may be used. When two display driver chips 30 are used, the two display driver chips 30 are both configured to be connected to some of the data signal lines 14.

In a specific implementation solution, the two display driver chips 30 are located on one side of the display, or the two display driver chips 30 are respectively located on two sides of the display. The two display driver chips 30 may be symmetrically disposed on two sides of the mobile terminal, or may be disposed on one side of the mobile terminal. In addition, there may be one display driver chip 30. When one display driver chip 30 is used, the display driver chip 30 is disposed on one side of the mobile terminal.

Still referring to FIG. 4, it can be learned from FIG. 4 that the display driver chips 30 provided in this embodiment of this application are disposed on the left and right sides of the panel 10 that is of the display and that has two curved bent sides. Therefore, it can be learned from FIG. 4 that the chip-on-film 20 affects only left and right frames of the display of the mobile terminal. Also referring to FIG. 5, an absolute length of the chip-on-film 20 in a strike direction of the curved bending area 122 is L. However, because the strike direction of the curved bending area 122 is an oblique downward direction, an increased width of the display is $1 = L * \cos \theta$, where $\theta$ is a bending angle of the curved bending area 122 of the display area 12. In other words, a frame width that needs to be added to the mobile terminal to cover the chip-on-film 20 is 1. In comparison to FIG. 2 in the prior art, it can be learned that if a length of a horizontal part of the chip-on-film 20 is L, a frame width required by the mobile terminal to cover the length L of the chip-on-film 20 also needs to be L. It can be apparently learned from the foregoing comparison that impact 1 of the display in this application on a side frame of the mobile terminal is less than impact L of the display in the prior art on a bottom frame of the mobile terminal. In addition, in this embodiment of this application, the gate scanning lines 13 are located on the bottom side of the display panel 10. Grid signals are controlled by corresponding GOA (Gate on Array) circuits on the top and bottom sides of the display panel 10, and the GOA circuits are connected to the display driver chips 30. Because the display driver chips 30 are disposed on the left and right sides of the display panel 10, a width of the bottom frame of the display panel 10 can be effectively reduced.

It can be learned from the foregoing description that the display provided in this embodiment properly uses the bending area of the display panel 10. Impact of the chip-on-film 20 on a width of the mobile terminal in a horizontal direction is changed to impact in an oblique direction. Therefore, a width occupied by the chip-on-film 20 in the horizontal direction is reduced. Further, the frame width of the mobile terminal is reduced. In addition, the display driver chip 30 is moved from the bottom side of the mobile terminal to the left side (or the right side) of the mobile terminal, so that the width of the bottom frame of the mobile terminal can be effectively reduced, and a narrow frame of the mobile terminal can be developed.

Embodiment 2

Figure 6:
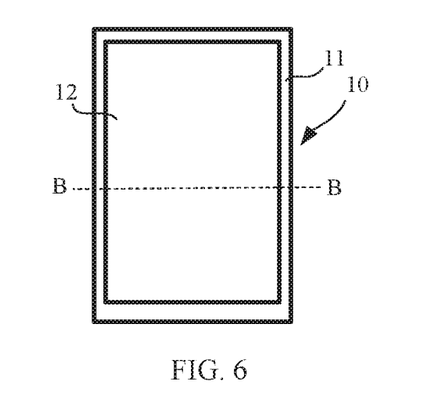
FIG. 6 is a schematic structural diagram of a display panel according to an embodiment of this application.
Figure 7:
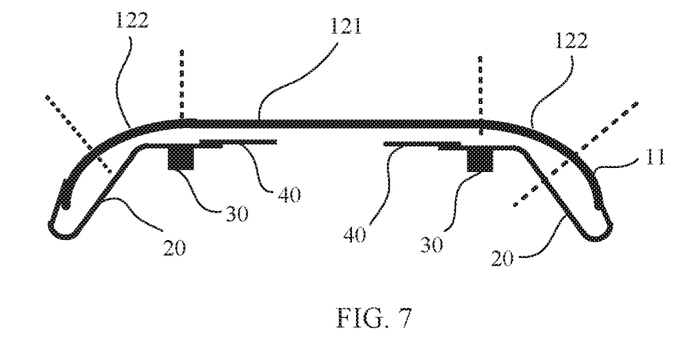
FIG. 7 is a sectional view of a B-B part in FIG. 6.
Figure 8:
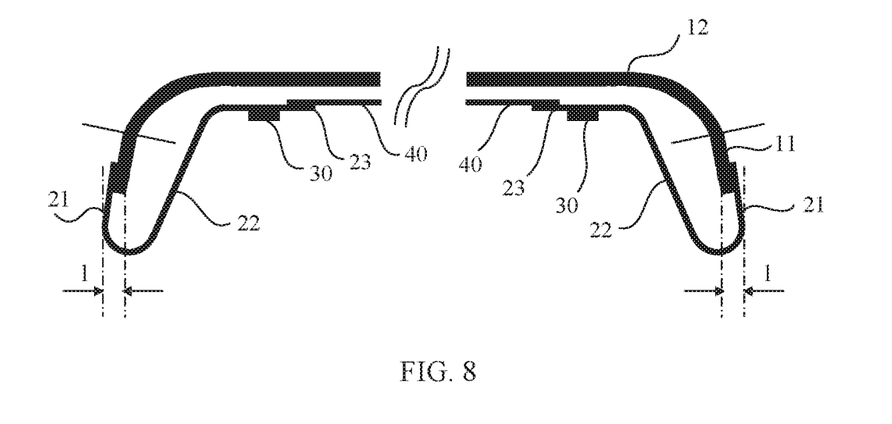
FIG. 8 is a schematic diagram of a connection between a display driver chip and a display panel.

As shown in FIG. 6, FIG. 7, and FIG. 8, a structure of a display panel 10 provided in this embodiment is a structure of the display panel 10 described above. To be specific, the display panel 10 includes a display area 12 and a non-display area 11. As shown in FIG. 7, curved bending areas 122 are on the left and right sides of the display area 12 of the display panel 10, and the non-display area 11 connected to the curved bending areas 122 is disposed in a strike direction of the curved bending areas 122. Therefore, a bending structure is formed on each of the left and right sides of the display panel 10. Data scanning lines 14 on the display panel 10 extend to the left and right sides of the display panel 10, and are connected to a display driver chip 30 by using a chip-on-film 20.

Referring to FIG. 7 and FIG. 8, it can be learned that there are two display driver chips 30 provided in this embodiment, and the two display driver chips 30 are symmetrically disposed on two sides of the display panel 10. A connection manner of a display driver chip 30 on each side is the same as a connection manner of the display driver chip 30 shown in FIG. 5 in Embodiment 1, and details are not described herein again.

Figure 11:
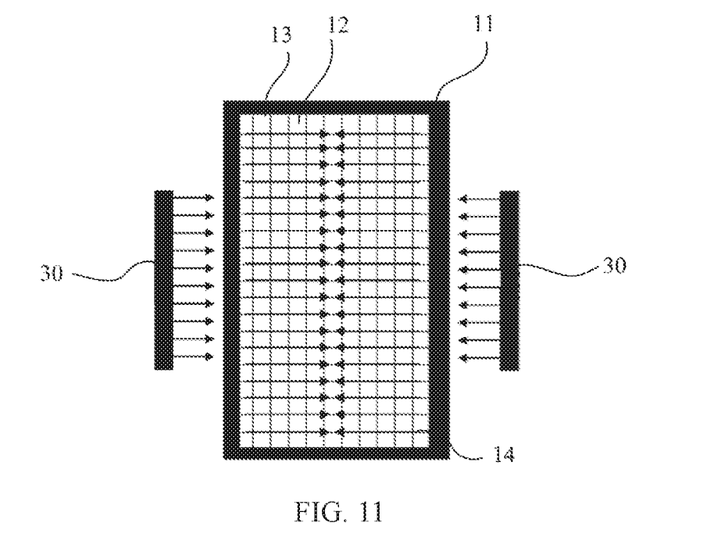
Figure 12:
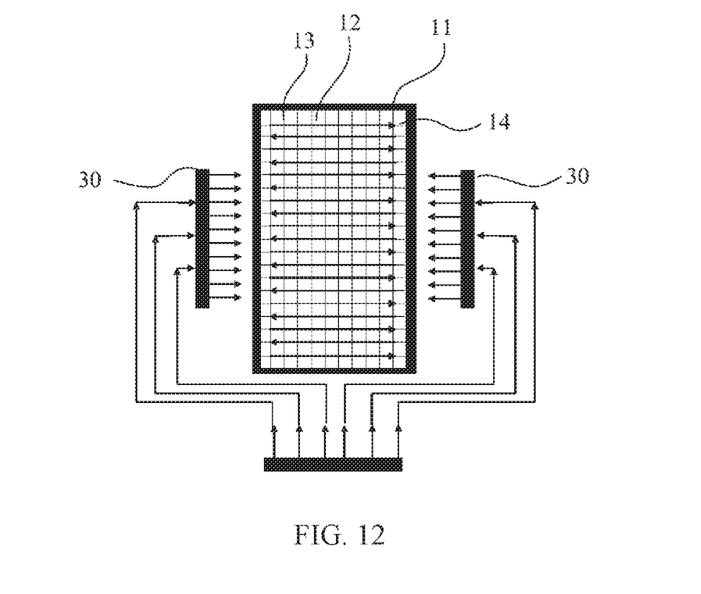

Referring to FIG. 11 and FIG. 12, FIG. 11 is a schematic structural diagram when display driver chips 30 are disposed on two sides of the display panel 10. FIG. 11 shows that two display driver chips 30 are connected to each data signal line 14, and each display driver chip 30 controls some of the data signal lines 14. FIG. 12 shows a staggered control manner of two display driver chips 30. To be specific, one display driver chip 30 controls data signal lines 14 in even-numbered rows, and the other display driver chip 30 controls data signal lines 14 in odd-numbered rows.

It can be learned from the foregoing descriptions in Embodiment 1 and Embodiment 2 that the display provided in this embodiment properly uses the bending area of the display panel 10. The impact of the chip-on-film 20 on the width of the mobile terminal in the horizontal direction is changed to the impact in the oblique direction. Therefore, the width occupied by the chip-on-film 20 in the horizontal direction is reduced. Further, the frame width of the mobile terminal is reduced. In addition, the display driver chip 30 is moved from the bottom side of the mobile terminal to the left side (or the right side) of the mobile terminal, so that the width of the bottom frame of the mobile terminal can be effectively reduced, and the narrow frame of the mobile terminal can be developed.

Figure 13:
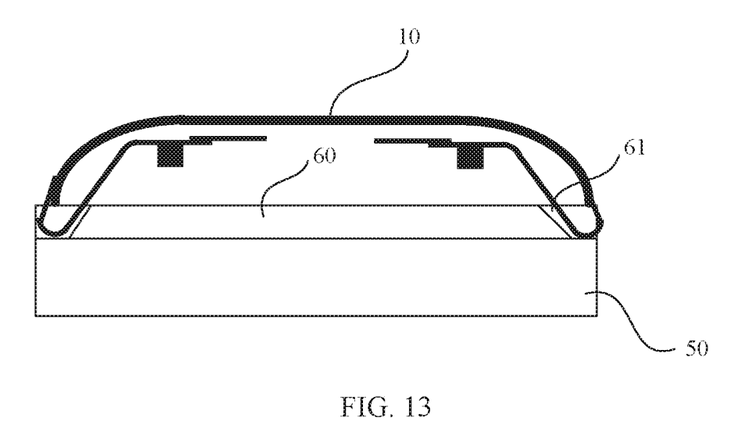
FIG. 13 is a schematic structural diagram of a mobile terminal according to an embodiment of this application.

In addition, an embodiment of this application further provides a mobile terminal. As shown in FIG. 13, the mobile terminal may be a common mobile terminal in the prior art, such as a mobile phone, a tablet, or a notebook computer. The mobile terminal includes a housing 50, a middle frame 60 disposed in the housing 50, the display according to any one of the foregoing embodiments, and a mainboard, where the display and the mainboard are disposed on the middle frame 60. Also referring to FIG. 4, a display driver chip 30 is connected to the mainboard (not shown) by using a flexible circuit board 40. Specifically, when the display driver chip 30 is connected to the mainboard, the flexible circuit board 40 is connected to one main flexible circuit board. A touch control device of the display and another electric device are disposed on the main flexible circuit board. In addition, the main flexible circuit board is connected to the mainboard by using a connection terminal. Therefore, when a problem occurs on the display, the entire display may be separated from the mainboard by directly removing the connection terminal.

In a specific implementation solution, as shown in FIG. 13, a groove 61 configured to accommodate the chip-on-film 20 is made in the middle frame 60. Therefore, the chip-on-film 20 can be placed in the groove 61. The chip-on-film 20 may be protected to some extent, and that the chip-on-film 20 is compressed to cause impact on use performance of the chip-on-film 20 may also be avoided.

It can be learned from the foregoing description that the display provided in this embodiment properly uses the bending area of the display panel 10. The impact of the chip-on-film 20 on the width of the mobile terminal in the horizontal direction is changed to the impact in the oblique direction. Therefore, the width occupied by the chip-on-film 20 in the horizontal direction is reduced. Further, the frame width of the mobile terminal is reduced. In addition, the display driver chip 30 is moved from the bottom side of the mobile terminal to the left side (or the right side) of the mobile terminal, so that the width of the bottom frame of the mobile terminal can be effectively reduced, and the narrow frame of the mobile terminal can be developed.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:
1. A display, comprising:
   data signal lines;
   gate scanning lines;
   a display panel, wherein the data signal lines and the gate scanning lines are crossed and are arranged in a grid shape on the display panel, and wherein the display panel comprises:
   a display area comprising:
      a planar area;
      a curved bending area located on at least one of two longitudinal sides of the planar area, wherein the curved bending area is curved to define a concave space, and wherein a longitudinal direction of each of the data signal lines is perpendicular to a direction of one longitudinal side of the planar area on which the curved bending area is arranged;
an outer face; and
an inner face located opposite of the outer face and defining the concave space; and
a non-display area surrounding an outer end of the curved bending area, wherein a portion of the non-display area overlaps at least a portion of the outer face, and wherein each of the data signal lines extends to the non-display area on a side of the curved bending area; and
a display driver chip coupled to the data signal lines on the display panel using a chip-on-film, wherein the chip-on-film is bent in the concave space, and wherein the display driver chip is located in the concave space.

2. The display of claim 1, wherein the display area comprises two curved bending areas, and wherein the two curved bending areas are arranged on two opposite sides of the planar area.

3. The display of claim 2, further comprising two display driver chips, wherein one of the two display driver chips is connected to part of the data signal lines using a first chip-on-film, and wherein the other one of the two display driver chips is connected to remaining data signal lines by a second chip-on-film.

4. The display of claim 1, wherein the chip-on-film comprises a connecting portion connected to the data signal lines, wherein a first bending portion is connected to the connecting portion, and wherein the first bending portion is located in the concave space.

5. The display of claim 4, wherein the display driver chip is disposed at the first bending portion.

6. The display of claim 4, wherein the chip-on-film further comprises a second bending portion connected to the first bending portion, wherein the second bending portion is located in the concave space, and wherein the display driver chip is disposed at the second bending portion.

7. The display of claim 1, wherein the chip-on-film is a single-layer chip-on-film, and wherein the display driver chip is located on one side of the chip-on-film that faces away from the display panel.

8. The display of claim 1, wherein the chip-on-film is a double-layer chip-on-film, and wherein the display driver chip is located on one side of the chip-on-film that faces toward or away from the display panel.

9. A mobile terminal, comprising:
a housing;
a middle frame disposed in the housing;
a mainboard disposed on the middle frame; and
a display disposed on the middle frame and comprising:
data signal lines;
gate scanning lines;
a display panel, wherein the data signal lines and the gate scanning lines are crossed and arranged in a grid shape on the display panel, and wherein the display panel comprises:
a display area comprising:
a planar area; and
a curved bending area located on at least one of two longitudinal sides of the planar area, wherein the curved bending area is curved to define a concave space, and wherein a longitudinal direction of each of the data signal lines is perpendicular to a direction of one longitudinal side of the planar area on which the curved bending area is arranged;
an outer face; and
an inner face located opposite of the outer face and defining the concave space; and
a non-display area surrounding an outer end of the curved bending area, wherein a portion of the non-display area overlaps at least a portion of the outer face, and wherein each of the data signal lines extends to the non-display area on a side of the curved bending area of the display area; and
a display driver chip connected to the mainboard using a flexible circuit board and connected using a chip-on-film to the data signal lines that extend to the non-display area, wherein the chip-on-film is bent in the concave space, and wherein the display driver chip is located in the concave space.

10. The mobile terminal of claim 9, wherein the middle frame comprises a groove configured to accommodate the chip-on-film.

11. The mobile terminal of claim 9, wherein the display area comprises two curved bending areas, and wherein the two curved bending areas are arranged on two opposite sides of the planar area.

12. The mobile terminal of claim 11, further comprising two display driver chips, wherein one of the two display driver chips is connected to part of the data signal lines by a first chip-on-film, and wherein the other one of the two display driver chips is connected to remaining data signal lines by a second chip-on-film.

13. The mobile terminal of claim 9, wherein the chip-on-film comprises a connecting portion connected to the data signal lines, wherein a first bending portion is connected to the connecting portion, and wherein the first bending portion is located in the concave space.

14. The mobile terminal of claim 13, wherein the display driver chip is disposed at the first bending portion.

15. The mobile terminal of claim 13, wherein the chip-on-film further comprises a second bending portion connected to the first bending portion, wherein the second bending portion is located in the concave space, and wherein the display driver chip is disposed at the second bending portion.

16. The mobile terminal of claim 9, wherein the chip-on-film is a single-layer chip-on-film, and wherein the display driver chip is located on one side of the chip-on-film that faces away from the display panel.

17. The mobile terminal of claim 9, wherein the chip-on-film is a double-layer chip-on-film, and wherein the display driver chip is located on one side of the chip-on-film that faces toward or away from the display panel.

18. The mobile terminal of claim 9, wherein the chip-on-film is a double layer chip-on-film, and wherein the display driver chip is located on one side of the double layer chip-on film that faces toward the display panel.

19. The mobile terminal of claim 9, wherein the chip-on-film is a double layer chip-on-film, and wherein the display driver chip is located on one side of the double layer chip-on film that faces away from the display panel.

20. The mobile terminal of claim 9, wherein the display further comprises gate on array (GOA) circuits coupled to the display driver chip.

* * * * *